United States Patent
Yoshida

(10) Patent No.: US 7,071,760 B2
(45) Date of Patent: Jul. 4, 2006

(54) FILTER CIRCUIT AND DETECTION CIRCUIT HAVING FILTER CIRCUIT

(75) Inventor: Akira Yoshida, Chiba (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/947,448

(22) Filed: Sep. 23, 2004

(65) Prior Publication Data

US 2005/0068094 A1   Mar. 31, 2005

Related U.S. Application Data

(62) Division of application No. 10/341,414, filed on Jan. 14, 2003, now Pat. No. 6,812,780.

(60) Provisional application No. 60/348,372, filed on Jan. 16, 2002.

(30) Foreign Application Priority Data

May 29, 2000   (JP)   .............................. 2000-157536

(51) Int. Cl.
*G05F 7/44* (2006.01)
*G05G 7/16* (2006.01)

(52) U.S. Cl. .................................... 327/359

(58) Field of Classification Search ................ 327/359; 455/326, 333; 330/252, 253
See application file for complete search history.

(56) References Cited

U.S. PATENT DOCUMENTS

| 5,764,100 A | 6/1998 | Callicotte et al. ............ 327/554 |
| 6,181,197 B1 | 1/2001 | Bret et al. .................... 327/557 |
| 6,184,748 B1 * | 2/2001 | Rao et al. ..................... 327/552 |
| 6,194,959 B1 | 2/2001 | Kamoshida et al. ......... 327/552 |
| 6,242,963 B1 * | 6/2001 | Su et al. ...................... 327/359 |
| 6,429,721 B1 * | 8/2002 | Armitage et al. ............ 327/359 |
| 6,566,951 B1 * | 5/2003 | Merrigan et al. ............ 330/254 |
| 2001/0028695 A1 * | 10/2001 | Matsui ........................ 375/376 |
| 2002/0181619 A1 * | 12/2002 | McCune, Jr. ................. 375/324 |
| 2004/0041616 A1 * | 3/2004 | Khlat et al. .................. 327/355 |

FOREIGN PATENT DOCUMENTS

JP   2001339275 A   12/2001

* cited by examiner

*Primary Examiner*—Quan Tra
(74) *Attorney, Agent, or Firm*—VolentineFrancos&Whitt PLLC

(57) ABSTRACT

A filter circuit has an input terminal which is input with a first current, and which is coupled with a first node, capacitor, of which one terminal is coupled with the first node, of which the other terminal is coupled with a second node, and which integrates the first current and outputs voltage, a transconductance means, of which one terminal is coupled with the first node, of which another terminal is coupled with the second node, of which the other terminal is coupled with a third node, and which outputs a second current being proportional to the voltage to the third node and an output terminal which is coupled with the first node, and which outputs the voltage.

25 Claims, 5 Drawing Sheets

FILTER CIRCUIT AND DETECTION CIRCUIT HAVING FILTER CIRCUIT

This is a divisional application of application Ser. No. 10/341,414, filed Jan. 14, 2003, now U.S. Pat. No. 6,812,780, which is hereby incorporated by reference in its entirety for all purposes. This claims priorty under 35 USC §119(e)(1) of Provisional Application No. 60/348,372, filed on Jan. 16, 2002.

BACKGROUND OF THE INVENTION

1. Field of the Invention

The present invention relates, in general, to a fitter circuit and, more particularly, to a filter circuit having a transconductance amplifier and a detection circuit having the filter circuit.

2. Description of the Prior Art

The conventional filter circuit is disclosed in "An Accurate Center Frequency Tuning Scheme for 450-khz CMOS Gm-C Bandpass Fifters", Hiroshi Yamazaki et al., IEEE Journal of Solid-State Circuits, vol. 34, No. 12, December 1999.

The conventional circuit having the conventional filter circuit will be described in FIG. 5. The conventional circuit comprises with a current outputting circuit 510, a current-voltage transferring circuit 520 connecting to the current outputting circuit 510 and a filter circuit 530 connecting to the current-voltage transferring circuit 520. The filter circuit 530 is a biquad bandpass filter. The filter circuit 530 has an input terminal 531, the transconductance amplifiers 532–535, the capacitors 536, 537 and an output terminal 538. Each transconductance amplifier has a voltage input terminal, a current input terminal and a current output terminal. The input terminal 531 is supplied with an input signal Vin of which type is voltage. The voltage input terminal of the transconductance amplifier 532 is connected to the input terminal 531. The current input terminal of the transconductance amplifier 532 is connected to a ground node which is supplied with the ground voltage. The current output terminal of the transconductance amplifier 532 is connected to the current input terminal of the transconductance amplifier 533, the current input terminal and the voltage input terminal of the transconductance amplifier 534, one terminal of the capacitor 536, the voltage input terminal of the transconductance amplifier 535 and the output terminal 538. The current output terminal of the transconductance amplifier 533 is connected to the ground node. The voltage input terminal of the transconductance amplifier 533 is connected to the current output terminal of the transconductance amplifier 535 and one terminal of the capacitor 537. The current output terminal of the transconductance amplifier 534, the other terminal of the capacitor 536, the current input terminal of the transconductance amplifier 535 and the other terminal of the capacitor 537 is connected to the ground node. The output terminal 538 outputs an output signal Vout.

Each transconductance value (the coefficient of voltage-current transfer) of the transconductance amplifiers 532–535 is gm. The capacitors 536, 537 have a capacitance value of C1 and C2, respectively. A transfer equation T(S) of the filter circuit 530 shown in FIG. 5 is:

$$T(s) = \frac{Vout}{Vin} = \frac{\frac{s}{gm \cdot C2}}{s^2 + \frac{s}{gm \cdot C2} + \frac{1}{gm^2 \cdot C1 \cdot C2}} \quad (1)$$

A transfer equation T(S) of a typical quadratic bandpass filter is:

$$T(s) = \frac{\frac{\omega_0}{Q}s}{s^2 + \frac{\omega_0}{Q}s + \omega_0^2} \quad (2)$$

In comparison between equations [1] and [1], the filter circuit 530 operates as the bandpass filter. In this example, tile cutoff frequency ω0 an. the quality factor Q are:

$$\omega_0 = \frac{1}{gm \cdot \sqrt{C1 \cdot C2}} \quad (3)$$

$$Q = \sqrt{\frac{C2}{C1}} \quad (4)$$

The filter circuit 530 covers scattering value of the element by adjusting the transconductance value of the transconductance amplifier, so the filter circuit 530 achieves high precision of the filter characteristics.

However, the conventional circuit having the conventional filter circuit has the current-voltage transferring circuit between the current outputting circuit and the filter circuit. The input terminal Vin of the filter circuit 530 does not input current but voltage. Therefore, the circuit scale of the conventional circuit having the filter circuit becomes large and the conventional circuit requires a measurable amount of power.

In addition, be transconductance, differing from the passive element such as inductor or resistor et al., have to use within the range that the amplitude of the input signal Vin does not exceed the input dynamic range. The filter circuit has to control the amplitude of the input signal Vin. The input signal Vin includes the main signal component and the frequency component of the passing band which is the same as the main signal component. Therefore, the efficiency of the filter circuit is inefficient.

SUMMARY OF THE INVENTION

According to one aspect of the present invention, there is provided a filter circuit having an input terminal which is input with a first current and which is coupled with a first node, a capacitor of which one terminal is coupled with the first node, of which the other terminal is coupled with a second node and which integrates the first current and outputs voltage, a transconductance means of which one terminal is coupled with the first node, of which another terminal is coupled with the second node, of which the other terminal is coupled with a third node and which outputs a second current being proportional to the voltage to the third node and an output terminal which is coupled with the first node and which outputs the voltage.

DETAILED DESCRIPTION OF THE PREFERRED EMBODIMENTS

A filter circuit according to the preferred embodiments of the present invention will be described. Moreover, not all the combinations of the characteristics of the present invention described in the embodiments arm essential to the present invention.

A filter circuit according to a first preferred embodiment of the present invention will be described with reference to FIGS. 1–2.

First, the composition of the filter circuit according to the first preferred embodiment of the present invention will be described. FIG. 1 is a circuit block diagram showing a circuit having a filter circuit according to the first preferred embodiment of the present invention.

Figure 1:
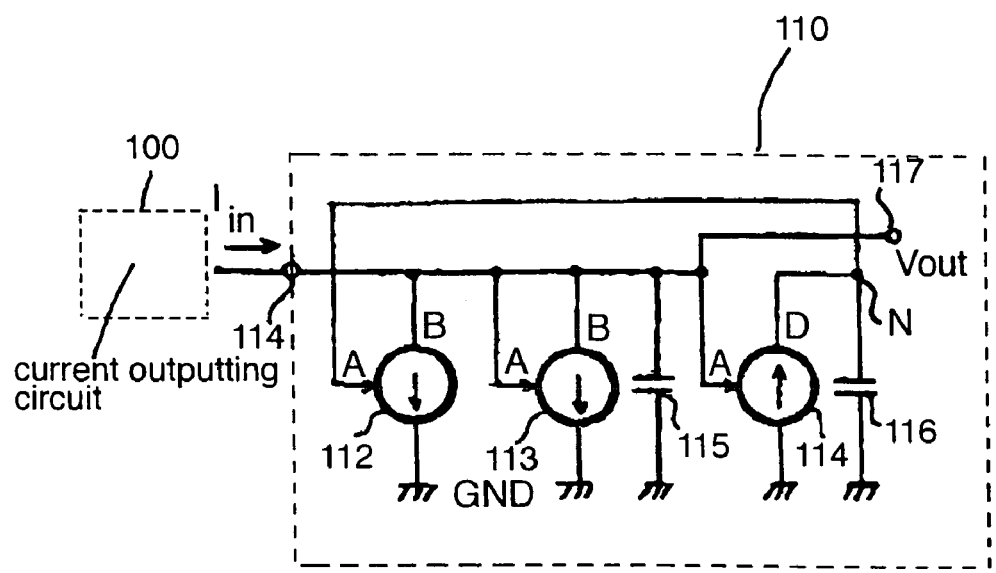
FIG. 1 is a circuit block diagram showing a circuit having a filter circuit according to a first preferred embodiment of the present invention.
Figure 2:
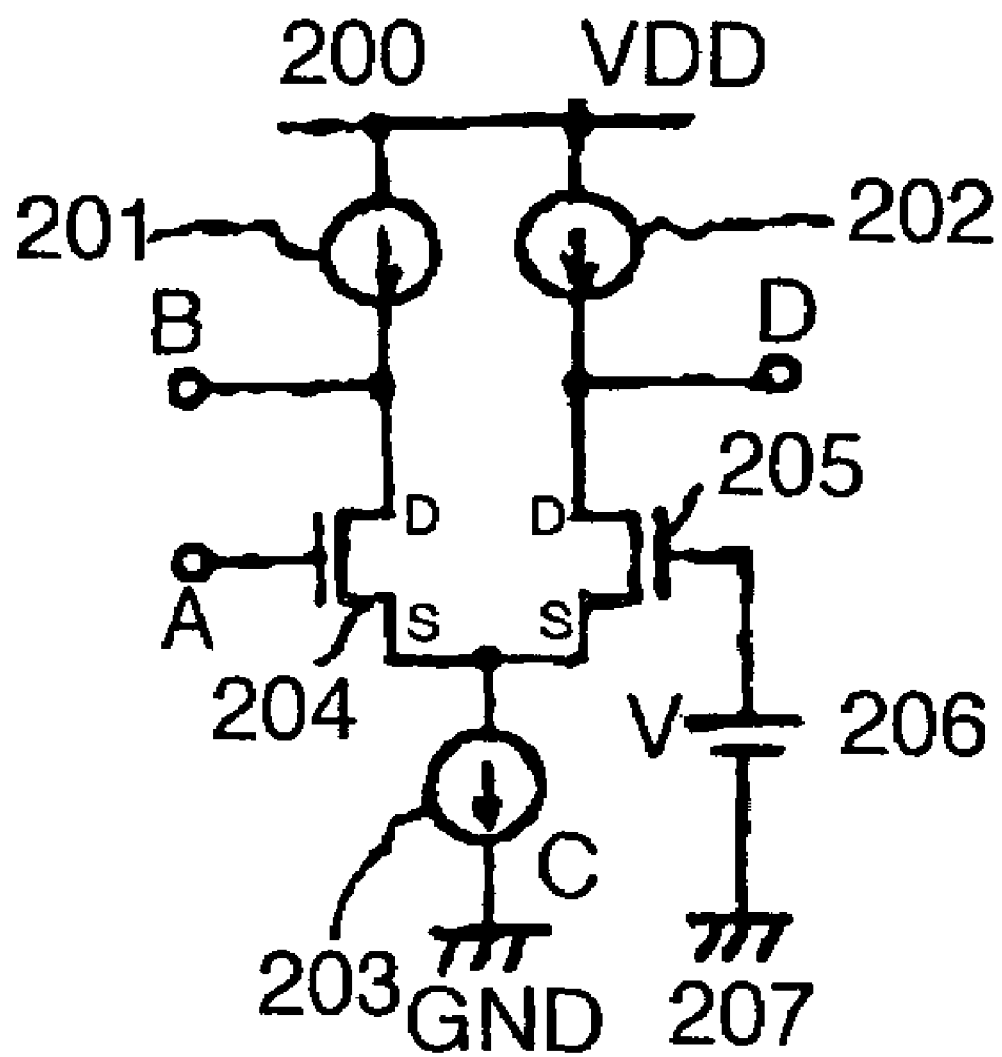
FIG. 2 is a circuit block diagram showing a transconductance amplifier according to the first preferred embodiment of the present invention.

As shown in FIG. 1, the circuit has a current outputting circuit 100 and a filter circuit 110 electrically coupling to the current outputting circuit 100.

The current outputting circuit 100 outputs current Iin to the filter circuit 110.

The filter circuit 110 is a quadratic biquad bandpass filter. The filter circuit 110 has an input terminal 111, transconductance amplifiers 112–114, capacitors 115–116, node N and an output terminal 117. Each transconductance amplifier has at least three terminals A–B and C or D. The input terminal 111 is coupled to the terminal B of the transconductance amplifier 112, the terminals A–B of the transconductance amplifier 113, the terminal A of the transconductance amplifier 114, one terminal of the capacitor 115 and the output terminal 117. The terminal A of the transconductance amplifier 112 is coupled to the node N. The terminals C of the transconductance amplifiers 112–114 are coupled to the ground node GND, respectively. The terminal D of the transconductance amplifier 114 is coupled to the node N. The other terminal of the capacitor 115 is coupled to the ground node GND. One of the characteristics of the filter circuit according to the first preferred embodiment of the present invention is that the capacitor 115 is connected to the input terminal 111 and the ground node GND. Therefore, the capacitor 115 integrates an input signal of which type is current and outputs a signal of which type is voltage. One terminal of the capacitor 116 is coupled to Fe node N and the other thereof is coupled to the ground node GND.

Next, the composition of the transconductance amplifier circuit according to the first preferred embodiment of the present invention will be described. FIG. 2 is a circuit block diagram showing a transconductance amplifier according to the first preferred embodiment of the present invention.

The transconductance amplifier has current sources 201–203, N-channel MOS transistors (NMOS transistors) 204–205 and a voltage supplying circuit 206, Each NMOS transistor has a drain electrode (first electrode), a source electrode (second electrode) and a gate electrode (control electrode). One terminal of the current source 201 is coupled to the VDD voltage supply 200 and the other terminal thereof is coupled to the terminal B. One terminal of the current source 202 is coupled to the VDD voltage supply 200 and the other terminal thereof is coupled to the terminal D. One terminal of the current source 203 is coupled to the source electrodes of the NMOS transistors 204, 205 and the other terminal thereof is coupled to the ground node GND. The drain electrode of the NMOS transistor 204 is coupled to the terminal B, the source electrode thereof is coupled to one terminal of the current source 203 and the gate electrode thereof is coupled to the terminal A. The drain electrode of the NMOS transistor 205 is coupled to the terminal D, the source electrode thereof is coupled, to one terminal of the current source 203 and the gate electrode thereof is coupled to one terminal of the voltage supplying circuit 206. The gate electrode of the NMOS transistor 205 is supplied with constant voltage Vc. The other terminal of the voltage supplying circuit 206 is coupled to the ground node GND.

Each transconductance amplifier inputs or outputs current which is proportional to input voltage at the terminal A through the terminals B and D. The proportion coefficient (dividing output current by input current) is the transconductance value gm.

The operation of the fitter circuit according to the first preferred embodiment of the present invention will be described with the transfer equation.

Current value of an Input signal which is input to the input terminal 111 is current in. Voltage of an output signal which is output from the node N is Va. The voltage of the output terminal 117 is Vout. The capacitor 115 has a capacitance value of C1. The capacitor 116 has a capacitance value of C2. A simultaneous equation is:

$$Iin = Vout*gm + Vout/s*C1 + Va*gm$$

$$Vout*gm = Va/s*C2$$

Therefore, a transfer equation Z(s) is:

$$Z(s) = \frac{Vout}{Vin} = \frac{\frac{s}{gm^2 \cdot C2}}{s^2 + \frac{s}{gm \cdot C2} + \frac{1}{gm^2 \cdot C1 \cdot C2}} \tag{5}$$

By comparison between the transfer equation [1] of the conventional filter circuit and the transfer equation [5] of the filter circuit according to the first preferred embodiment of the present invention, the equation is given as:

$$Z(s) = T(s)/gm$$

The transconductance value gm is fixed value and does not depend on the frequency. Therefore, the gain of the transfer equation Z(s) is 1/gm against thereof the transfer equation T(s). Thus, the cutoff characteristic of the filter circuit according to the first preferred embodiment of the present invention is equal to thereof the conventional filter circuit.

The filter circuit according to the first preferred embodiment of the present invention inputs the signal of which type is current, and directly supplies the current with the capacitor. The filter circuit according to the first preferred embodiment of the present invention needs not to have the current-voltage transferring circuit. Therefore, the filter circuit according to the first preferred embodiment of the present invention reduces the circuit scale and electric power consumption.

A filter circuit according to a second preferred embodiment of the present invention will be described with reference to FIG. 3.

First, the composition of the filter circuit according to the second preferred embodiment of the present invention will be described. FIG. 3 is a circuit block diagram showing a circuit having a filter circuit according to the second preferred embodiment of the present invention. Like elements are given like or corresponding reference numerals in the first and second preferred embodiments. Thus, dual explanations of the same elements are avoided.

Figure 3:
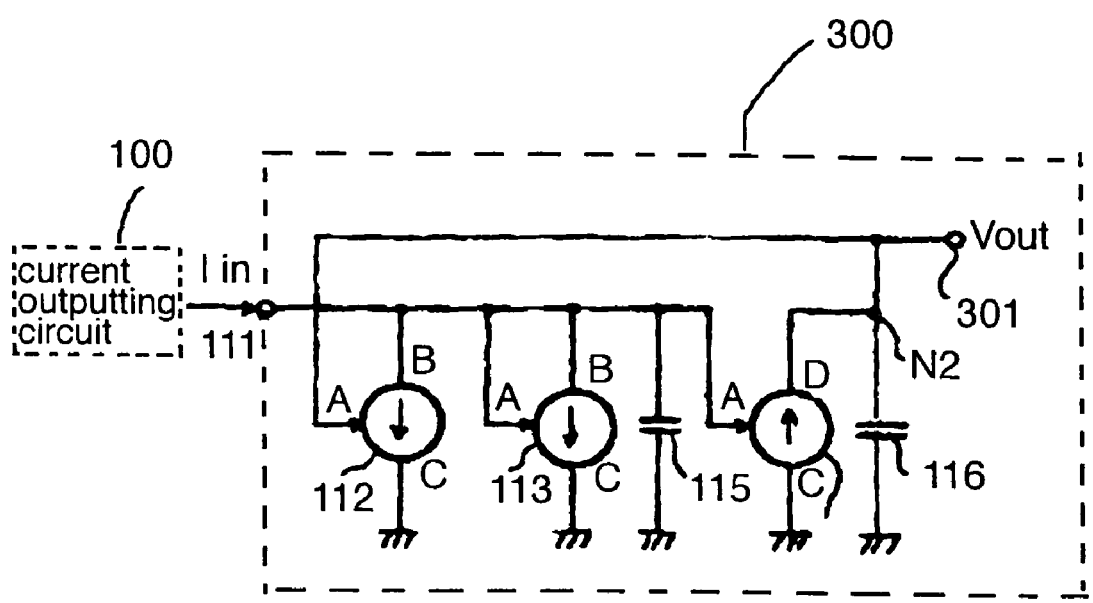
FIG. 3 is a circuit block diagram showing a circuit having a filter circuit according to a second preferred embodiment of the present invention.

As shown in FIG. 3, the circuit has the current outputting circuit 100 and a filter circuit 300 electrically coupling to the current outputting circuit 10. The filter circuit 300 is a quadratic biquad bandpass filter. The filter circuit 300 has an input terminal 111, transconductance amplifiers 112–114, capacitors 115–116, node N2 and an output terminal 301.

A difference the filter circuit 110 according to the first preferred embodiment and the filter circuit 300 according to the second preferred embodiment is the connection relationship with the output terminal 301. The node N2 is coupled to the terminal A of the transconductance amplifier 112, the terminal D of the transconductance amplifier 114, one terminal of the capacitor 116 and the output terminal 301. The output terminal 301 and the one terminal of the capacitor 115 are not directly connected to each other.

By the way, one of the characteristics of the filter circuit according to the second preferred embodiment of the present invention is that the capacitor 115 is connected to the input terminal 111 and the ground node GND. Therefore, the capacitor 115 integrates an input signal of which type is current and outputs a signal of which type is voltage.

The operation of the filter circuit according to the second preferred embodiment of the present invention will be described with the transfer equation. The transfer equation Z(s) is:

$$Z(s) = \frac{Vout}{Iin} = \frac{\frac{gm}{C1 \cdot C2}}{S^2 + \frac{gm \cdot S}{C1} + \frac{gm^2}{C1 \cdot C2}}. \quad (6)$$

The above transfer equation is the same as the equation of the low pass filter circuit. Therefore, the filter circuit according to the second preferred embodiment of the present invention operates as the low pass fitter of the current input type.

As the filter circuit according to the first preferred embodiment of the present invention, the filter circuit according to the second preferred embodiment of the present invention inputs the signal of which type is current, and directly supplies the current with the capacitor. The filter circuit according to the second preferred embodiment of the present invention needs not to have the current-voltage transferring circuit. Therefore, the filter circuit according to the second preferred embodiment of the present invention reduces the circuit is scale and electric power consumption.

In addition, the transfer equation of the filter circuit according to the second preferred embodiment of the present invention is the same as the transfer equation of the low-pass filter circuit, Therefore, the filter circuit according to the second preferred embodiment of the present invention operates as the low-pass filter circuit.

A detection circuit having a filter circuit according to a third preferred embodiment of the present invention will be described with reference to FIG. 4.

First, the composition of the detection circuit having the filter circuit according to the third preferred embodiment of the present invention will be described. FIG. 4 is a circuit block diagram showing the detection circuit having the filter circuit according to the third preferred embodiment of the present invention. Like elements are given like or corresponding reference numerals in the above preferred embodiments. Thus, dual explanations of the same elements are avoided.

Figure 4:
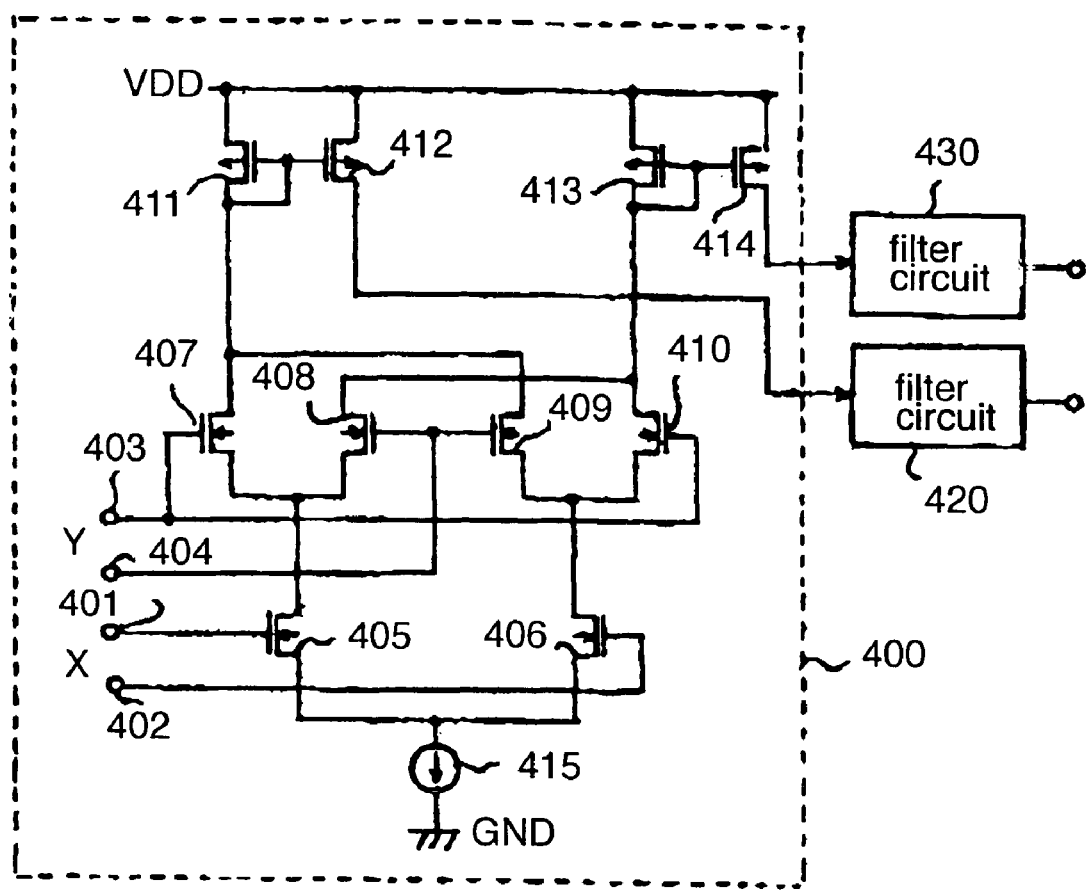
FIG. 4 is a circuit block diagram showing a detection circuit having a filter circuit according to a third preferred embodiment of the present invention.
Figure 5:
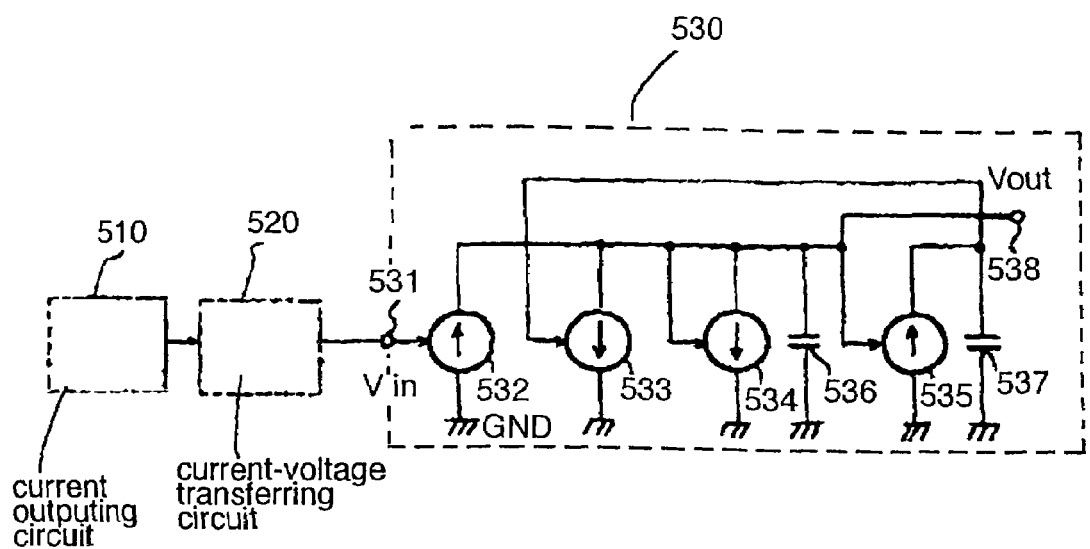
FIG. 5 is a circuit block diagram showing a conventional circuit having a conventional filter circuit.

As shown in FIG. 4, the detection circuit has a double balanced mixer 400 and filter circuits 420 and 430. The filter circuits 420 and 430 are the same as the filter circuits according to the first preferred embodiment of the present invention.

The double balanced mixer 400 has input terminals 401–404, N-channel MOS transistors (NMOS transistors) 405–410, P-channel MOS transistors (PMOS transistors) 411–414 and a current source 415. Each NMOS transistor has a source electrode (a first or a second electrode), a drain electrode (the second or the first electrode) and a gate electrode (a control electrode). Correspondingly, each PMOS transistor has a source electrode (a first or a second electrode), a drain electrode (the second or the first electrode) and a gate electrode (a control electrode).

The input terminals 401 and 402 are input with a balance input signal X, respectively. The input terminals 403 and 404 are input with a balance input signal Y, respectively. The input terminal 401 is coupled to a gate electrode of NMOS transistor 405. The input terminal 402 is coupled to a gate electrode of NMOS transistor 406. Source electrodes of NMOS transistors 405 and 406 are coupled to one terminal of the current source 415. The other terminal of the current source 415 is coupled to a ground node GND which is supplied with ground voltage. A drain electrode of NMOS transistor 405 is coupled to source electrodes of NMOS transistors 407 and 408. A drain electrode of NMOS transistor 406 is coupled to source electrodes of NMOS transistors 409 and 410. The input terminal 403 is coupled to gate electrodes of NMOS transistors 407 and 410. The input terminal 404 is coupled to gate electrodes of NMOS transistors 406 and 409. A drain electrode of NMOS transistor 407 is coupled to a drain electrode of NMOS transistor 409, a drain and gate electrodes of PMOS transistor 411 and a gate electrode of PMOS transistor 412. Source electrodes of PMOS transistors 411 and 412 are coupled to a supply voltage node VDD which is supplied with supply voltage. A drain electrode of PMOS transistor 412 is coupled to the filter circuit 420. PMOS transistors 411 and 412 are composed of a current mirror circuit. A drain electrode of NMOS transistor 408 is coupled to a drain electrode of NMOS transistor 410, a drain and gate electrodes of PMOS transistor 413 and a gate electrode of PMOS transistor 414, The source electrodes of PMOS transistors 413 and 414 are coupled to the supply voltage node VDD. A drain electrode of PMOS transistor 414 is coupled to the filter circuit 430. PMOS transistors 413 and 414 are composed of a current mirror circuit.

The operation of the detection circuit according to the third preferred embodiment of the present invention will be described with the transfer equation.

The double balanced mixer 400 is typical circuit operating as a multiplexer, The frequency of the balance input signal X is f1. The frequency of the balance input signal Y is f2 (f1>f2). The main frequency components of current which is output by PMOS transistor 412 is f1+f2. The main frequency components of current which is output by PMOS transistor 414 is f1−f2. According to characteristics of the double balanced mixer 400, output levels of both frequency components are same each other. The output current of the main frequency components is Icomp which is supplied to the filter circuits 420 and 430. The peak value of the output current is 2*Icomp.

By the way, an input dynamic range of the filter circuit 420 is described next. The input terminal and output terminal of the filter circuit 420 are connected to each offer, as shown in FIG. 1. When the input dynamic range of the filter circuit 420 is Vdyn, the peak current value of the input current Iin should be required the followings equations.

$$V\text{dyn} \geq V\text{out} = Z(s)*I\text{in}$$

$$2*I\text{comp} \leq V\text{dyn}/Z(s) \quad [7]$$

As mentioned above, the peak value 2*Icomp is the sum of the output current of f1+f2 and the output current of f1−f2. Therefore, the double balanced mixer 400 outputs only when the peak current Icomp of each frequency component meets equation [7]. When the frequency of the pass band of the filter circuit 420 is f1−f2, Me unnecessary frequency components f1+f2 which is output by the double balanced mixer 400 is cut off at the point of being input it into the filter circuit 420. Because the input and output terminals are connected with each other, Therefore, the frequency components which is input into the filter circuit 420 is the desired value f1−f2 and its peak current value is Icomp. The equation [8] showing input dynamic range of the transconductance amplifier in the filter circuit 420 is:

$$I\text{comp} \leq V\text{dyn}/Z(s) \quad [8]$$

As compared with the equation [7] the equation [8] shows that the output level of the double balanced mixer 400 is allowed up to two times. Because the unnecessary frequency components are cut off at an input phase of the filter circuit.

The detection circuit having a filter circuit according to the third preferred embodiment of the present invention cuts off the unnecessary frequency components at an input phase of the filter circuit. Therefore, the detection circuit having a filter circuit according to the third preferred embodiment of the present invention causes the output level of the double to balanced mixer to be large.

While the preferred form of the present invention has been described, it is to be understood that modifications will be apparent to those skilled in the art without departing from the spirit of the invention.

For example, the filter circuit shown in the first preferred embodiment is an equation biquad bandpass filter. However, the 2*degree biquad bandpass fitter is used instead of the equation biquad bandpass filter according to connecting the equation biquad bandpass to the number of n in series. For example, the filter circuit shown in the second preferred embodiment is an equation biquad lowpass filter. However, the 2*n-degree biquad lowpass filter is used instead of the equation biquad lowpass filter according to connecting the equation biquad lowpass to the number of n in series. For example, the filter circuits according to the first and second preferred embodiments of the present invention use the biquad filter. The filter circuits are not limited to the biquad filters. The filter circuit having the transconductance amplifier is used. For example, two filter circuits are used in the detection circuit according the fourth preferred embodiment of the present invention. The number of the filter circuits is not limited to two. For example, the detection circuit according to the third preferred embodiment of the present invention uses the bandpass filter circuit shown in FIG. 1. However, the lowpass filter circuit shown in FIG. 3 may be used.

The scope of the invention, therefore, is to be determined solely by the following claims.

What is claimed is:

1. A detecting circuit comprising:
   a double balanced mixer having a first output and a second output, the double balanced mixer providing a first output current at the first output and a second output current at the second output;
   a first filter circuit connected to the first output of the double balanced mixer, the first filter circuit including a capacitor and a transconductance circuit; and
   a second filter circuit connected to the second output of the double balanced mixer, the second filter circuit receives the second output current from the double balanced mixer,
   the double balanced mixer having
      a first transistor which applies a first current to a first node according to a first signal,
      a second transistor which applies a second current to the first transistor according to a second signal,
      a third transistor which applies a third current to the first transistor according to a third signal, and
      a first current mirror circuit which applies a first voltage to the first output according to a fourth current which is supplied to the second transistor,
   the transconductance circuit having
      a first power node connected to have a first electrical potential applied thereto,
      a second power node connected to have a second electric potential applied thereto,
      an input node,
      a first current source connected to the first power node,
      a second current source connected to the first power node,
      a third current source connected to the second power node,
      a first voltage supply circuit connected to the second power node,
      a fourth transistor having a control electrode connected to the input node,
      a first electrode connected to the first current source and a second electrode connected to the third current source, and
      a fifth transistor having a control electrode connected to the first voltage supply circuit, a first electrode connected to the second current source and a second electrode connected to the third current source.

2. The detecting circuit according to claim 1, wherein the double balanced mixer further comprises:
   a sixth transistor which applies a fifth current to a second node according to a fourth signal;
   a seventh transistor which applies a sixth current to the sixth transistor according to the second signal;
   an eighth transistor which applies a seventh current to the sixth transistor according to the third signal; and
   a second current mirror circuit which applies a second voltage to the second output according to an eighth current which is supplied to the seventh transistor.

3. The detecting circuit according to claim 2, wherein the first through third transistors and the sixth through eighth transistors are N-channel MOSFETs.

4. A detection circuit comprising:
a double balanced mixer circuit having a first input terminal, a second input terminal, a first output terminal and a second output terminal;
a second filter circuit connected to the second output terminal of the double balanced mixer circuit; and
a first filter circuit connected to the first output terminal of the double balanced mixer circuit, the first filter circuit including
a first input terminal connected to the first output terminal of the double balanced mixer circuit and to a first node,
a first output terminal connected to the first node,
a first capacitor having a first terminal connected to the first node and a second terminal connected to a second node, and
a first transconductance circuit having a first terminal connected to the first node, a second terminal connected to the second node and a third terminal connected to a third node, the first transconductance circuit outputting a first current proportional to a voltage at the third node,
the first transconductance circuit having
a first current source connected to the first node,
a second current source,
a third current source connected to the second node,
a first transistor having a control electrode connected to the third node, a first electrode connected to the first current source and a second electrode connected to the third current source, and
a second transistor having a control electrode connected to a first voltage supply circuit, a first electrode connected to the second current source and a second electrode connected to the third current source, the first voltage supply circuit supplying a first control voltage for the control electrode of the second transistor and being connected to the second node.

5. The detection circuit according to claim 4, wherein the second filter circuit including
a second input terminal connected to the second output terminal of the double balanced mixer circuit and to a fourth node,
a second output terminal connected to the fourth node,
a second capacitor having a first terminal connected to the fourth node and a second terminal connected to a fifth node, and
a second transconductance circuit having a first terminal connected to the fourth node, a second terminal connected to the fifth node and a third terminal connected to a sixth node, the second transconductance circuit outputting a second current proportional to a voltage at the sixth node, wherein the second transconductance circuit having
a fourth current source connected to the fourth node,
a fifth current source,
a sixth current source connected to the fifth node,
a third transistor having a control electrode connected to the sixth node, a first electrode connected to the fourth current source and a second electrode connected to the sixth current source, and
a fourth transistor having a control electrode connected to a second voltage supply circuit, a first electrode connected to the fifth current source and a second electrode connected to the sixth current source, the second voltage supply circuit supplying a second control voltage for the control electrode of the fourth transistor and being connected to the fifth node.

6. The detection circuit according to claim 4, wherein the second node is supplied with a ground voltage.

7. The detection circuit according to claim 4, wherein the first filter circuit further including a second transconductance circuit having a first terminal connected to the first node, a second terminal connected to the second node and a third terminal connected to the third node.

8. The detection circuit according to claim 5, wherein the second filter circuit further including a third transconductance circuit having a first terminal connected to the fourth node, a second terminal connected to the fifth node and a third terminal connected to the sixth node.

9. A detection circuit comprising:
a first filter circuit having an input terminal and an output terminal connected to the input terminal thereof, the first filter circuit including a first capacitor and a first transconductance circuit;
a second filter circuit having an input terminal and an output terminal connected to the input terminal thereof; and
a double balanced mixer circuit having a first input terminal, a second input terminal, a first output terminal connected to the input terminal of the first filter circuit, and a second output terminal connected to the input terminal of the second filter circuit, the double balanced mixer circuit including
a current source connected to a first power supply,
a first switch circuit connected to the current source and the first input terminal of the double balanced mixer circuit, the first switch circuit operating in response to a signal input to the first input terminal of the double balanced mixer circuit,
a second switch circuit connected to the first switch circuit and the second input terminal of the double balanced mixer circuit, the second switch circuit operating in response to a signal input to the second input terminal of the double balanced mixer circuit,
a first current mirror circuit connected to a second power supply, the second switch circuit and the first output terminal of the double balanced mixer circuit, and
a second current mirror circuit connected to the second power supply, the second switch circuit and the second output terminal of the double balanced mixer circuit,
the first filter circuit including
a first input terminal connected to the first output terminal of the double balanced mixer circuit and to a first node;
a first output terminal connected to the first node;
the first capacitor having a first terminal connected to the first node and a second terminal connected to a second node; and
the first transconductance circuit having a first terminal connected to the first node, a second terminal connected to the second node and a third terminal connected to a third node, the first transconductance circuit outputting a first current proportional to a voltage at the third node, wherein the first transconductance circuit having
a first current source connected to the first node,
a second current source,
a third current source connected to the second node,
a first transistor having a control electrode connected to the third node, a first electrode connected to the first current source and a second electrode connected to the third current source, and a second transistor having a control electrode connected to a first voltage supply circuit, a first electrode connected to the second current source and a second electrode connected to the third current source, the first voltage supply circuit supplying a first control voltage for the control electrode of the second transistor and being connected to the second node.

10. The detection circuit according to claim 9, wherein the first input terminal of the double balanced mixer circuit includes a first positive input terminal and a first negative input terminal.

11. The detection circuit according to claim 10, wherein the first switch circuit includes:
a third transistor having a first terminal connected to the current source, a second terminal connected to the second switch circuit and a control terminal connected to the first positive input terminal of the double balanced mixer circuit; and
a fourth transistor having a first terminal connected to the current source, a second terminal connected to the second switch circuit and a control terminal connected to the first negative input terminal of the double balanced mixer circuit.

12. The detection circuit according to claim 9, wherein the second input terminal of the double balanced mixer circuit includes a second positive input terminal and a second negative input terminal.

13. The detection circuit according to claim 12, wherein the second switch circuit includes:
a third transistor having a first terminal connected to the first switch circuit, a second terminal connected to the second current mirror circuit and a control terminal connected to the second positive input terminal of the double balanced mixer circuit;
a fourth transistor having a first terminal connected to the first switch circuit, a second terminal connected to the first current mirror circuit and a control terminal connected to the second negative input terminal of the double balanced mixer circuit;
a fifth transistor having a first terminal connected to the first switch circuit, a second terminal connected to the second current mirror circuit and a control terminal connected to the second negative input terminal of the double balanced mixer circuit; and
a sixth transistor having a first terminal connected to the first switch circuit, a second terminal connected to the first current mirror circuit and a control terminal connected to the second positive input terminal of the double balanced mixer circuit.

14. The detection circuit according to claim 9, wherein the first current mirror circuit including:
a third transistor having a first terminal connected to the second switch circuit, a second terminal connected to the second power supply and a control terminal connected to the first terminal thereof; and
a fourth transistor having a first terminal connected to the first output terminal of the double balanced mixer circuit, a second terminal connected to the second power supply and a control terminal connected to the control terminal of the third transistor.

15. The detection circuit according to claim 9, wherein the second current mirror circuit including:
a third transistor having a first terminal connected to the second switch circuit, a second terminal connected to the second power supply and a control terminal connected to the first terminal thereof; and
a fourth transistor having a first terminal connected to the second output terminal of the double balanced mixer circuit, a second terminal connected to the second power supply and a control terminal connected to the control terminal of the third transistor.

16. The detection circuit according to claim 9, wherein the second filter circuit including:
a second input terminal connected to the second output terminal of the double balanced mixer circuit and to a fourth node;
a second output terminal connected to the fourth node;
a second capacitor having a first terminal connected to the fourth node and a second terminal connected to a fifth node; and
a second transconductance circuit having a first terminal connected to the fourth node, a second terminal connected to the fifth node and a third terminal connected to a sixth node, the second transconductance circuit outputting a second current proportional to a voltage at the sixth node, wherein the second transconductance circuit having
a fourth current source connected to the fourth node,
a fifth current source,
a sixth current source connected to the fifth node,
a third transistor having a control electrode connected to the sixth node, a first electrode connected to the fourth current source and a second electrode connected to the sixth current source, and
a fourth transistor having a control electrode connected to a second voltage supply circuit, a first electrode connected to the fifth current source and a second electrode connected to the sixth current source, the second voltage supply circuit supplying a second control voltage for the control electrode of the fourth transistor and being connected to the fifth node.

17. The detection circuit according to claim 9, wherein the second node is supplied with a ground voltage.

18. The detection circuit according to claim 9, wherein the first filter circuit including a third transconductance circuit having a first terminal connected to the first node, a second terminal connected to the second node and a third terminal connected to the third node.

19. The detection circuit according to claim 16, wherein the second filter circuit further including a third transconductance circuit having a first terminal connected to the fourth node, a second terminal connected to the fifth node and a third terminal connected to the sixth node.

20. The detection circuit according to claim 1, wherein the transconductance circuit receives an electric current at the input node thereof.

21. The detection circuit according to claim 1, wherein the second filter circuit includes a second capacitor and a second transconductance circuit.

22. The detection circuit according to claim 21, wherein the second transconductance circuit of the second filter circuit receives an electric current at an input node thereof.

23. The detection circuit according to claim 21, wherein the second transconductance circuit of the second filter circuit has
a third power node connected to have a third electric potential applied thereto;

a fourth power node connected to have a fourth electric potential applied thereto;
a second input node;
a fourth current source connected to the third power node;
a fifth current source connected to the third power node;
a sixth current source connected to the fourth power node;
a second voltage supply circuit connected to the fourth power node;
a sixth transistor having a control electrode connected to the second input node, a first electrode connected to the fourth current source and a second electrode connected to the sixth current source; and a seventh transistor having a control electrode connected to the second voltage supply circuit, a first electrode connected to the fifth current source and a second electrode connected to the sixth current source.

24. The detection circuit according to claim 9, wherein the second filter circuit includes a second capacitor and a second transconductance circuit.

25. The detection circuit according to claim 24, wherein the second transconductance circuit of the second filter circuit receives an electric current at an input node thereof.

* * * * *